(12) United States Patent
Hannon et al.

(10) Patent No.: US 6,353,246 B1
(45) Date of Patent: Mar. 5, 2002

(54) SEMICONDUCTOR DEVICE INCLUDING DISLOCATION IN MERGED SOI/DRAM CHIPS

(75) Inventors: Robert Hannon, Wappingers Falls; Subramanian S. Iyer, Mt. Kisco; Scott R. Stiffler, Amenia; Kevin R. Winstel, Hopewell Junction, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/197,693

(22) Filed: Nov. 23, 1998

(51) Int. Cl.[7] .................. H01L 27/01; H01L 27/12; H01L 31/0392; H01L 29/00
(52) U.S. Cl. ............ 257/350; 257/351; 257/347; 257/349; 257/501; 257/506
(58) Field of Search .................. 257/353, 507, 257/347, 348, 349, 622, 350, 354, 501, 506, 351; 438/152, 155

(56) References Cited

U.S. PATENT DOCUMENTS

| | | | | |
|---|---|---|---|---|
| 3,791,024 A | * | 2/1974 | Boleky, III | 29/577 |
| 4,763,183 A | | 8/1988 | Ng et al. | 357/23.7 |
| 4,777,147 A | | 10/1988 | Scott et al. | 437/57 |
| 5,081,062 A | * | 1/1992 | Vasudev et al. | 437/132 |
| 5,250,836 A | | 10/1993 | Miura et al. | 257/506 |
| 5,258,318 A | | 11/1993 | Buti et al. | 437/34 |
| 5,294,823 A | * | 3/1994 | Eklund et al. | 257/370 |
| 5,479,048 A | * | 12/1995 | Yallup et al. | 257/350 |
| 5,480,832 A | | 1/1996 | Miura et al. | 437/67 |
| 5,618,745 A | * | 4/1997 | Kita | 438/164 |
| 5,702,988 A | | 12/1997 | Liang | 438/238 |
| 5,723,895 A | * | 3/1998 | Takahashi | 257/350 |
| 5,731,619 A | | 3/1998 | Subbanna | 257/374 |
| 5,733,813 A | | 3/1998 | Chen et al. | 438/440 |
| 5,740,099 A | * | 4/1998 | Tanigawa | 257/351 |
| 6,096,584 A | * | 8/2000 | Ellis-Monaghan et al. | 438/151 |
| 6,150,695 A | * | 11/2000 | Gardner et al. | 257/347 |
| 6,288,427 B2 | * | 9/2001 | Huang | 257/350 |

FOREIGN PATENT DOCUMENTS

| | | | | |
|---|---|---|---|---|
| JP | | 58-185 | * 1/1983 | 257/353 |

* cited by examiner

Primary Examiner—Eddie Lee
Assistant Examiner—Jesse A. Fenty
(74) Attorney, Agent, or Firm—Connolly Bove Lodge & Hutz LLP; Joseph P. Abate, Esq.

(57) ABSTRACT

A semiconductor device structure including a substrate including at least one silicon-on-insulator substrate region and at least one non-silicon-on-insulator region. The at least one silicon-on-insulator region and at least one non-silicon-on-insulator region are formed in a pattern in the substrate. At least one trench is arranged in the vicinity of at least at a portion of a boundary between a silicon-on-insulator substrate region and the non-silicon-on-insulator substrate region. The at least one trench is arranged in at least one of the silicon-on-insulator region and the non-silicon-on-insulator region.

20 Claims, 1 Drawing Sheet

SEMICONDUCTOR DEVICE INCLUDING DISLOCATION IN MERGED SOI/DRAM CHIPS

FIELD OF THE INVENTION

The invention relates to a semiconductor device that includes both silicon-on-insulator (SOI) and non-SOI devices.

BACKGROUND OF THE INVENTION

Semiconductor-on-insulator (SOI) technology relates to high-speed MOS and CMOS circuits. According to SOI, a thin layer of semiconductor material is implanted in an insulator to reduce the capacitive coupling between the semiconductor layer and the underlying substrate material.

SUMMARY OF THE INVENTION

The present invention provides a method for fabricating both SOI and non-SOI devices on a single semiconductor chip and a semiconductor device structure that includes both SOI and non-SOI devices on a single semiconductor chip.

In accordance with these and other objects and advantages, the present invention provides a semiconductor device structure. The structure includes a substrate including at least one silicon-on-insulator substrate region and at least one non-silicon-on-insulator region. The at least one silicon-on-insulator region and at least one non-silicon-on-insulator region are formed in a pattern in the substrate. At least one trench is arranged in the vicinity of at least at a portion of a boundary between a silicon-on-insulator substrate region and a non-silicon-on-insulator substrate region. The at least one trench is arranged in at least one of the silicon-on-insulator region and the non-silicon-on-insulator region.

Other aspects of the present invention provide a method for forming a semiconductor device structure. The method includes providing a substrate including at least one silicon-on-insulator region and at least one non-silicon-on-insulator region. At least one trench is provided arranged at least at a portion of a boundary between the silicon-on-insulator substrate region and the non-silicon-on-insulator substrate region.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

Figure 1:
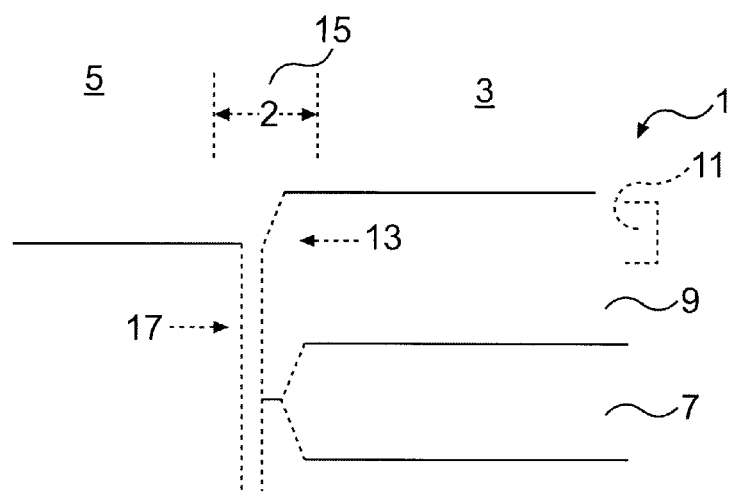
FIG. 1 represents a cross-sectional view of an embodiment of a portion of a semiconductor device structure according to the present invention.

In certain circumstances, it is desirable to provide both SOI and non-SOI devices on one chip. However, silicon-on-insulator structures and devices may not be compatible with non-silicon-on-insulator structures and devices. For example, SOI devices, while they may be optimal in some cases, are not readily implementable in trench DRAM technology.

In an SOI substrate, a buried layer of oxide is formed in a silicon substrate. Typically, another layer of substrate underlies the oxide portion. In a typical silicon substrate, the oxide layer may be represented by the formula $SiO_x$. In this formula, x is a number from 1 to 3.

Silicon-on-insulator devices are patterned in a layer of the substrate over the oxide layer in the substrate. In a typical silicon substrate, the SOI devices are patterned in silicon over a layer of $SiO_x$ in the substrate.

When the layer of oxide is formed in the substrate to create a silicon-on-insulator substrate region, there is typically a volume expansion when oxidizing the substrate to form the oxide layer. In one case, the volume expansion is about 2.1 x. As a result of this volume expansion, large stresses may be built up in the substrate. As a result, trying to pattern the $SiO_x$ layer in the wafer may cause a high level of dislocations to be formed. The dislocations can result in non-manufacturable processes unless they can be filtered out.

The present invention provides a solution to the above-problems, among others, by providing a method and structure for filtering dislocations to provide a merged SOI and non-SOI semiconductor device structure. The present invention does this by providing a semiconductor device structure that includes an SOI substrate that includes at least one silicon-on-insulator substrate region and at least one non-silicon-on-insulator substrate region. The silicon-on-insulator substrate region is selectively formed by implanting an oxide in the substrate. The oxide may be implanted in any particular pattern, to create a substrate that includes at least one SOI region and at least one non-SOI, or bulk, region.

According to the present invention, at least one trench is provided arranged in the vicinity of at least a portion of at least one boundary between at least one silicon-on-insulator substrate region and at least one non-silicon-on-insulator substrate region. The silicon-on-insulator substrate region(s) may include silicon-on-insulator device structures, while the non-silicon-on-insulator substrate region(s), or bulk regions, may include non-silicon-on-insulator device structures.

The at least one trench may be arranged at a boundary between the silicon-on-insulator substrate region and the non-silicon-on-insulator region. Alternatively, the at least one trench may be arranged in the vicinity of the boundary between the silicon-on-insulator substrate region and the non-silicon-on-insulator substrate region. In some embodiments, the trench(es) may be provided on either side or both sides of an interface between SOI and bulk regions. Where the at least one trench is provided in the vicinity of the boundary region, the at least one trench may be arranged at least partially within the silicon-on-insulator substrate region or within the non-silicon-on-insulator substrate region. However, typically, the at least one trench is arranged at the border.

The at least one trench may extend everywhere where a border exists between the silicon-on-insulator substrate region and a non-silicon-on-insulator substrate region. In some embodiments, a plurality of trenches extend everywhere where this a boundary between the silicon-on-insulator substrate region and a non-silicon-on-insulator substrate region. Where the present invention includes a plurality of discontinuous trenches with portions of substrate between them. In other words, while the present invention could include trenches that extend everywhere where a boundary exists between the silicon-on-insulator substrate region and non-silicon-on-insulator substrate region, it is not necessary that the trench or trenches be continuous.

The present invention may include at least one deep and/or shallow trench. Some embodiments of the present invention may include a plurality of trenches. Where the present invention includes more than one trench, some could be deep trenches and others shallow trenches.

The trench(es) could be circular or oval shaped. Alternatively, trenches could be provided in rows of elongated trenches.

According to some embodiments, the present invention includes a plurality of parallel trenches at boundary regions between silicon-on-insulator substrate regions and non-silicon-on-insulator substrate region. Where the present invention includes a plurality of parallel trenches, at least one of the trenches could be a deep trench. Alternatively, a plurality of the parallel trenches could be deep trenches. According to one embodiment that includes a plurality of parallel trenches, one of the trenches is a deep trench while the others are shallow trenches. Similarly, a plurality of parallel trenches can include more than one deep trench and more than one shallow trench. For example, parallel trenches could include a plurality of alternating shallow and deep trenches.

Typically, the number and size of the trenches is sufficient to filter out dislocations. According to typical embodiments, the at least one trench may have a depth of the at least one trench may have a depth of about 0.1 $\mu$m to about 10 $\mu$m and a width of about 0.1 $\mu$m to about 1 $\mu$m, and extend, either singly or as a group, along about 1 percent to about 99 percent of the boundary between the silicon-on-insulator substrate region and the non-silicon-on-insulator substrate region. For shallow trenches, the at least one trench may have a depth of about 0.1 $\mu$m to about 5 $\mu$m and a width of about 0.1 $\mu$m to about 1 $\mu$m, and extend, either singly or collectively, along about 1 percent to about 99 percent of the boundary between the silicon-on-insulator substrate region and the non-silicon-on-insulator substrate region. On the other hand, for deep trenches, the at least one trench may have a depth of about 5 $\mu$m to about 10 $\mu$m and a width of about 0.1 $\mu$m to about 1 $\mu$m, and extend, either singly or collectively, along about 1 percent to about 99 percent of the boundary between the silicon-on-insulator substrate region and the non-silicon-on-insulator substrate region. When referring to the extension of the trench(es) along a certain percentage of a boundary between SOI and bulk regions of a substrate, it is intended to indicate that one trench may cover the boundary portion. Alternatively, when adding up the distance covered by a plurality of trenches, the total area could cover the boundary portion.

Typically, the trenches are filled. The trenches may be filled with dielectric, semiconductor, and/or metal. Particular materials that the trench(es) could be filled with include polycrystalline silicon, amorphous silicon, silicon oxide, $SiO_x$, and/or $Si_xN_4$.

As stated above, the present invention is particularly useful where it is desirable to include silicon-on-insulator devices and a DRAM structure.

FIG. 1 illustrates a cross-sectional view a portion of an embodiment of a device according to the present invention. The embodiment illustrated in FIG. 1, a substrate 1 includes a silicon-on-insulator region 3 and a non-silicon-on-insulator region 5. The silicon-on-insulator region 3 of the substrate 1 includes a buried oxide region 7 below a region 9 of non-oxidize substrate.

The silicon-on-insulator region includes a volume expansion 11 resulting from the oxidation of the buried oxide layer. As a result of the volume expansion, stress is created at least in region 13 in the silicon-on-insulator substrate region. As a solution to this problem, the present invention includes at least one trench 17 in a boundary region 15 between the silicon-on-insulator substrate region and the non-silicon-on-insulator substrate region to filter out dislocations. The embodiment illustrated in FIG. 1 includes one deep trench 17 in the vicinity of the boundary between the silicon-on-insulator substrate region and the non-silicon-on-insulator substrate region.

Figure 2:
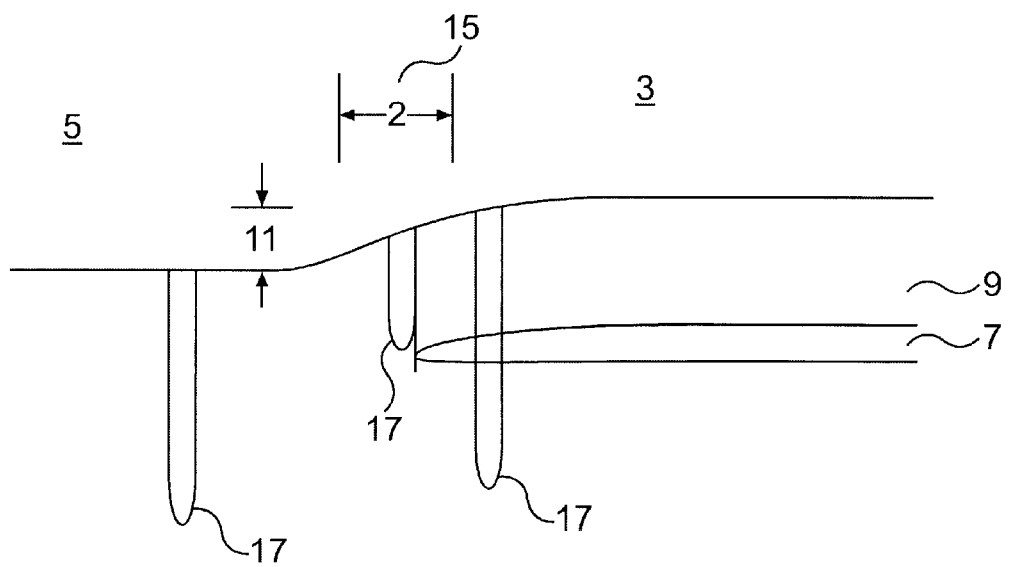
FIG. 2 represents a cross-sectional view of another embodiment of a portion of a semiconductor device structure according to the present invention.

FIG. 2 illustrates a cross-sectional view of another embodiment of a structure according to the present invention. The numbering of the structures in FIG. 2 is consistent with FIG. 1.

Figure 3:
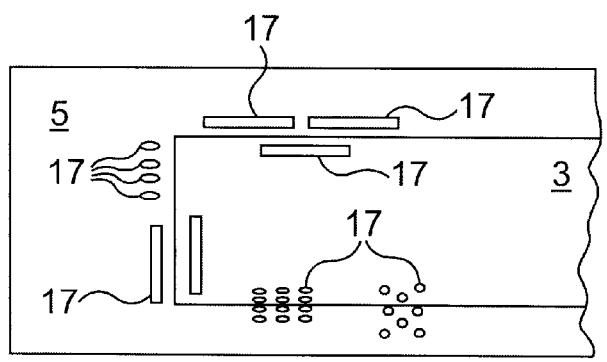
FIG. 3 represents a top plan view of a further embodiment of a portion of a semiconductor device structure according to the present invention.

FIG. 3 represents a top plan view of a further embodiment of a structure according to the present invention. FIG. 3 illustrates a variety of trench structures and arrangements that may be included in a structure according to the present invention. An embodiment of the present invention could include any one or more of the trench arrangements illustrated in FIG. 3. Alternatively, the present invention could include another arrangement of trenches. Again, FIG. 3 utilizes the same numbering as in FIGS. 1 and 2.

As stated above, the present invention also includes a method of forming a semiconductor device structure. The method includes providing a substrate including a silicon-on-insulator region and a non-silicon-on-insulator region. Those of ordinary skill in the art are aware of processes for forming SOI substrate structures, such as implanting a buried oxide. Therefore, such processes will not be discussed further herein. A mask for implanting the oxide may be formed with photoresist and standard photolithography techniques. The structure may be subjected to an annealing process after oxide implant.

After forming a pattern of silicon-on-insulator regions(s) and bulk region(s) in a substrate, at least one trench may be provided arranged in the vicinity of a boundary between at least one silicon-on-insulator substrate region and at least one non-silicon-on-insulator substrate region. Typically, the at least one trench is formed such that it extends at least as deep as the oxide region of the silicon-on-insulator substrate region. However, the trench(es) may be formed to any desired depth.

The at least one trench may be formed with a number and arrangement of trenches described above. After forming the at least one trench, the at least one trench may be filled with materials described above. As referred to above, typically, the size, number, arrangement, depth and other parameters of the trench are sufficient to filter out dislocations.

Before, after, and/or during formation of the trench and filling of the trench, silicon-on-insulator device structures and non-silicon-on-insulator device structures may be formed on the substrate. For example, a DRAM structure could be formed on the substrate.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A semiconductor device structure, comprising:
   a substrate including at least one buried silicon-on-insulator substrate region and at least one non-silicon-on-insulator region in the substrate, wherein the at least one buried silicon-on-insulator region and at least one non-silicon-on-insulator region are formed in a pattern in the substrate; and
   at least one trench arranged in the substrate in the vicinity of at least a portion of a boundary between at least one of the at least one silicon-on-insulator substrate regions and at least one of the at least one non-silicon-on-insulator substrate regions, wherein the at least one trench is arranged in at least one of the silicon-on-insulator region and the non-silicon-on-insulator region, wherein said at least one trench includes a plurality of deep trenches and a plurality of shallow trenches parallel to and alternating with said deep trenches.

2. The semiconductor device structure according to claim 1, further comprising:
   silicon-on-insulator device structures on the silicon-on-insulator substrate region; and
   non-silicon-on-insulator device structures on the non-silicon-on-insulator substrate region.

3. The semiconductor device structure according to claim 1, wherein the insulator in the silicon-on-insulator structure is $SiO_x$, where x is a number from 1 and 3.

4. The semiconductor device structure according to claim 1, wherein the at least one trench includes at least one of a deep trench and a shallow trench.

5. The semiconductor device structure according to claim 1, including a plurality of trenches, wherein the trenches are square, circular, or oval or are rows of trenches.

6. The semiconductor device structure according to claim 1, wherein the at least one trench includes a plurality of parallel deep trenches.

7. The semiconductor device structure according to claim 1, wherein the at least one trench includes at least one deep trench and at least one shallow trench parallel to the at least one deep trench.

8. The semiconductor device structure according to claim 1, wherein the at least one trench is arranged at all points along the boundary between the silicon-on-insulator structure and the non-silicon-on-insulator structure.

9. The semiconductor device structure according to claim 8, wherein the at least one trench includes at least one deep trench.

10. The semiconductor device structure according to claim 8, wherein the at least one trench includes a plurality of parallel deep trenches.

11. The semiconductor device structure according to claim 8, wherein the at least one trench includes at least one deep trench and at least one shallow trench parallel to the at least one deep trench.

12. The semiconductor device structure according to claim 8, wherein the at least one trench has a size sufficient to filter out dislocations.

13. The semiconductor device according to claim 1, wherein the at least one trench is filled with at least one material selected from the group consisting of dielectric, semiconductor, and metal.

14. The semiconductor device according to claim 1, wherein the at least one trench is filled with at least one material selected from the group consisting of polycrystalline silicon, amorphous silicon, silicon oxide, $SiO_x$, and $Si_xN_4$.

15. The semiconductor device structure according to claim 1, wherein the semiconductor device structure includes a DRAM structure.

16. The semiconductor device structure according to claim 1, wherein the at least one trench has a size sufficient to filter out dislocations.

17. The semiconductor device according to claim 1, wherein the at least one trench is arranged at the boundary between the silicon-on-insulator substrate region and the non-silicon-on-insulator substrate region.

18. The semiconductor device according to claim 1, wherein the at least one trench has a depth of about 0.1 $\mu$m to about 10 $\mu$m and a width of about 0.1 $\mu$m to about 1 $\mu$m, and extends along about 1 percent to about 99 percent of the boundary between the silicon-on-insulator substrate region and the non-silicon-on-insulator substrate region.

19. The semiconductor device according to claim 1, wherein the at least one trench has a depth of about 0.1 $\mu$m to about 5 $\mu$m and a width of about 0.1 $\mu$m to about 1 $\mu$m, and extends along about 1 percent to about 99 percent of the boundary between the silicon-on-insulator substrate region and the non-silicon-on-insulator substrate region.

20. The semiconductor device according to claim 1, wherein the at least one trench has a depth of about 5 $\mu$m to about 10 $\mu$m and a width of about 0.1 $\mu$m to about 1 $\mu$m, and extends along about 1 percent to about 99 percent of the boundary between the silicon-on-insulator substrate region and the non-silicon-on-insulator substrate region.

* * * * *